United States Patent [19]
Tsutsui

[11] Patent Number: 5,925,901
[45] Date of Patent: Jul. 20, 1999

[54] FIELD EFFECT TRANSISTOR WITH PLATED HEAT SINK ON A FET CHIP

[75] Inventor: Hiroaki Tsutsui, Tokyo, Japan

[73] Assignee: NEC Corporation, Japan

[21] Appl. No.: 08/824,020

[22] Filed: Mar. 21, 1997

[51] Int. Cl.$^6$ .......................... H01L 29/80; H01L 31/112; H01L 23/34

[52] U.S. Cl. .......................... 257/276; 257/275; 257/712; 257/713

[58] Field of Search .................................. 257/276, 275, 257/712, 713, 341

[56] References Cited

FOREIGN PATENT DOCUMENTS 63-131555  6/1988  Japan ....................................... 257/275
6-5880     1/1994  Japan ....................................... 257/276

Primary Examiner—Steven H. Loke
Attorney, Agent, or Firm—Hayes, Soloway, Hennessey, Grossman & Hage, P.C.

[57] ABSTRACT

A GaAs substrate is divided at boundary regions of unit cells of FET chips. With such construction, magnitude of curling of the GaAs substrate due to a difference of thermal expansion coefficients between the GaAs substrate and the PHS upon heating during assembling, can be reduced. In a semiconductor device with a PHS, the magnitude of curling of the semiconductor substrate after assembling can be reduced by reducing stress upon assembling, without causing degradation of reliability.

5 Claims, 13 Drawing Sheets

FIELD EFFECT TRANSISTOR WITH PLATED HEAT SINK ON A FET CHIP

BACKGROUND OF THE INVENTION

1. Field of the Invention

The present invention relates generally to a field effect transistor provided with a PHS (plated heat sink) on a FET chip.

2. Description of the Related Art

Such type of a field effect transistor (FET) will be discussed using a high-power GaAs FET as an example.

FIG. 1 is a plan view of the conventional high-power GaAs FET provided with a PHS (plated heat sink) of a gold plated layer on the back surface of the conventional GaAs substrate, and FIG. 2 is a section taken along line II—II of FIG. 1. In the shown high-power GaAs FET, a FET chip is formed with four unit cells 3 (shown by surrounding with two dotted lines) arranged in parallel. The unit cell 3 has a gate electrode, a drain electrode and a source electrode. These electrodes are comb-shaped configuration with finger-shaped gate electrode Gf, finger-shaped drain electrode Df and finger-shaped source electrode Sf, on an active region 2 formed in the surface portion of the substrate by ion implantation. Adjacent cells are connected by connecting respective source electrodes Sc to each other.

Similar structure can be realized in a multi-chip device constructed by combining a plurality of chips, each corresponding to one unit cell. However, in such case, due to positioning error between respective chips or differences of configuration of bonding wires connecting the chips, and other reasons, there are many factors which may cause degradation of high frequency characteristics, such as signal phase offset between the chips. Furthermore, the cost of assembling such devices becomes high. Thus, multi-chip devices are not practical.

In order to reduce thermal resistance, it is required to form the GaAs substrate 1 in a thickness of 30 to 50 μm, and, in order to maintain strength of the chip, a gold plated PHS is required in a thickness of 10 to 30 μm.

Upon loading such FET chip in a package 200 as shown in FIG. 3, a heat higher than or equal to a melting point of solder 100 is applied. At this time, due to difference of thermal expansion coefficients of the GaAs substrate 1 of the FET chip and the PHS 5, the cooled and bonded FET chip curls due to stress of thermal expansion. Accordingly, in the FET, bonding failure can be caused frequently to lower assembling yield of the FET.

As a solution for this, Japanese Unexamined Patent Publication (Kokai) No. Showa 63-131555 proposes a structure illustrated in FIGS. 4 and 5. Namely, the PHS is separated into a plurality of PHS fractions 5(5-1, 5-2, 5-3, 5-4 . . . ) by a plurality of slits 7(7-1,7-2, 7-3 . . . ) formed at a given interval. With such structure, deformation due to difference of thermal expansion coefficient upon loading in the package can be restricted and thus assembling yield can be improved.

However, by simply separating the PHS into a plurality of PHS fractions 5-1, 5-2 . . . by the slits 7-1, 7-2, 7-3 . . . , waving curling may be caused when the FET chip is mounted on the package 200, as shown in FIG. 6. Namely, at the portion where the slit 7 is not present, the layer structure becomes a two layer structure of the GaAs substrate 1 and the PHS 5 which causes local curling due to difference of thermal expansion coefficients. On the other hand, assuming that the electrode layer on the surface is thin enough to be ignored, at the portion where the slit is formed, the layer structure becomes a single layer of the GaAs substrate 1, in which deformation due to difference of the thermal expansion coefficients as not result. Furthermore, this portion has low mechanical strength due to absence of the PHS. As a result, while curling of the entire chip may not result, the portion of the GaAs substrate where the slit is provided is deformed to curl in the opposite direction to deforming direction of the portion where the slit is not provided, at quite small curvature due to the force to mechanically depressing the chip or the surface tension force of the molten solder. In general, stress of a thin film upon deformation of the thin film is inversely proportional to the curvature and proportional to the film thickness. Therefore, locally, quite large stress is concentrated in the GaAs substrate. In real terms, assuming that the layer thickness of the GaAs substrate is 30 μm and the thickness of the PHS is 15 μm, and width of the slit is about one tenth of the slit pitch, approximately 500 MPa of stress would be caused.

When about 300 MPa of stress is caused in the GaAs substrate, due to elevation of temperature during operation of the FET, shifting dislocation motion may be caused. This dislocation causes lowering of output of the FET with multiplication due to ion collision during FET operation. Thus, reliability of FET is lowered.

SUMMARY OF THE INVENTION

It is therefore an object of the present invention to provide a field effect transistor which avoids deformation of the semiconductor substrate and stress concentration thereto and lowering of reliability due to stress.

A field effect transistor, according to the present invention, has finger-shaped gate electrodes selectively covering the active region on a primary surface portion of a semiconductor substrate. A plurality of sets of finger-shaped source electrodes and finger-shaped drain electrodes selectively covering said active region are arranged at opposite sides of said finger-shaped gate electrodes. Adjacent finger-shaped gate electrodes are arranged to have the finger-shaped source electrode or the finger-shaped drain electrode therebetween in common. Thus, unit cells are formed the finger-shaped source electrodes of mutually adjacent unit cells are connected by a source electrode connecting portion. A plated heat sink is formed on the back side opposite to the primary surface of the semiconductor substrate.

In such case, the plated heat sink may be connected to the source electrode connecting portion at the separating portion.

An insulative resin layer may be formed over the finger-shaped gate electrodes, the finger-shaped source electrodes and the finger-shaped drain electrodes.

The plated heat sink may be separated for each unit cell. Since the semiconductor substrate is divided for each unit cell, magnitude of curling due to difference of thermal expansion coefficients between the semiconductor substrate and the PHS can be reduced.

Also, according to the present invention, since the FET chip is divided for each unit cell, deformation and stress concentration of the semiconductor substrate can be avoided to prevent reliability of FET from being lowered.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

Figure 1:
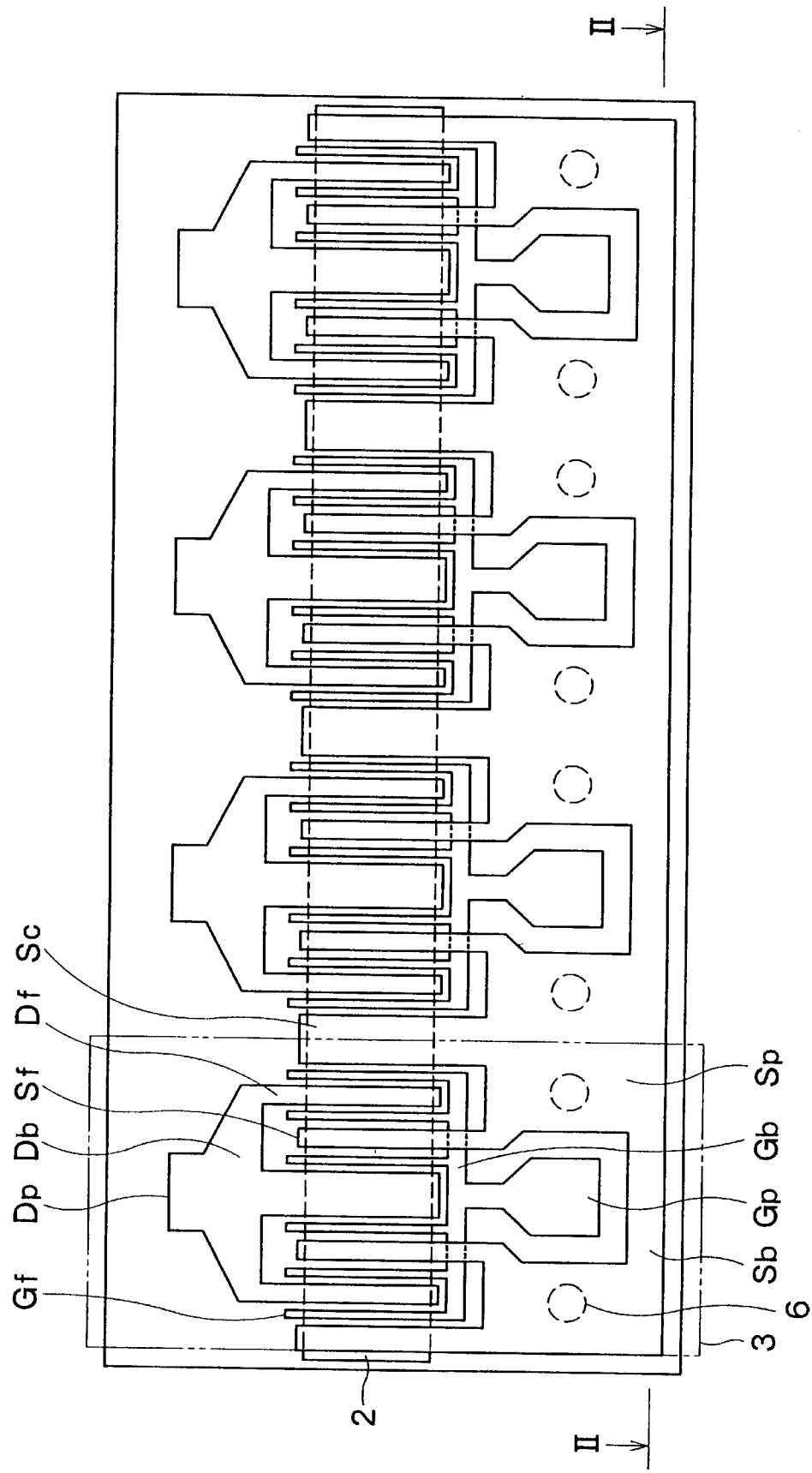
FIG. 1 is a plan view of the first conventional FET chip.
Figure 2:
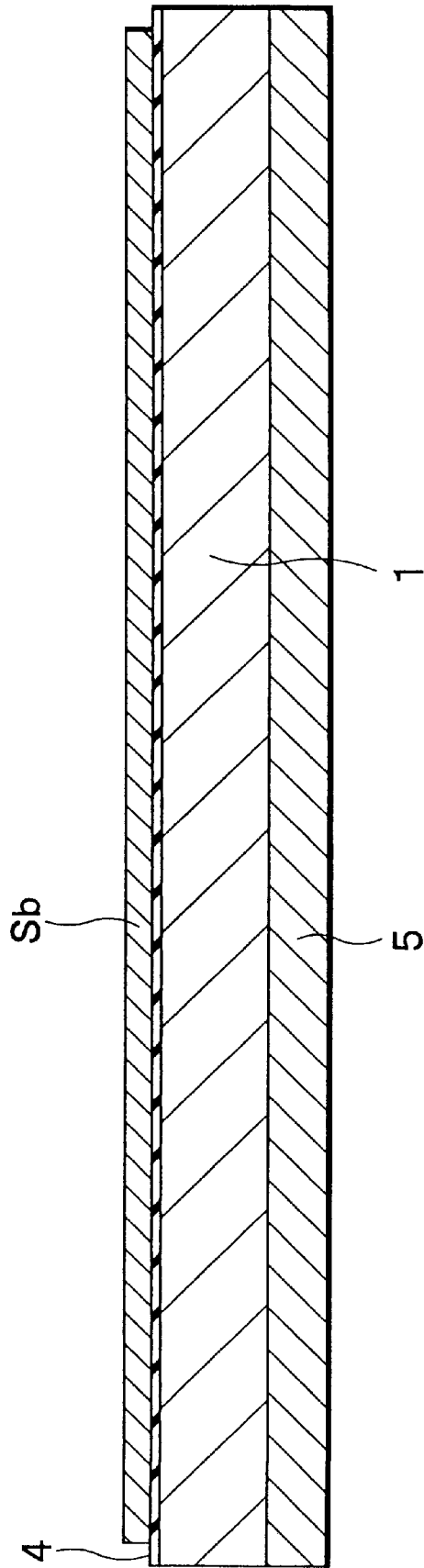
FIG. 2 is a section taken along line II—II of FIG. 1.
Figure 3:
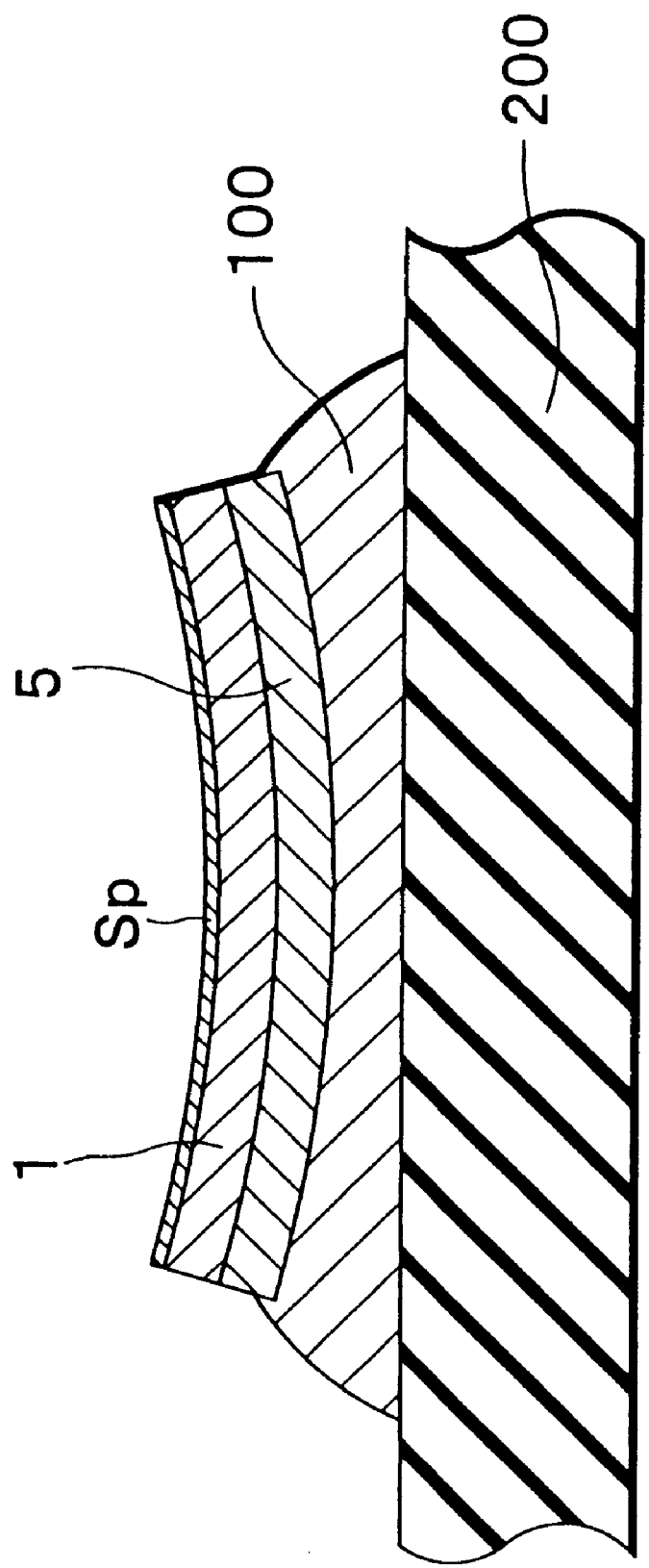
FIG. 3 is a section for explanation for the first conventional FET chip.
Figure 4:
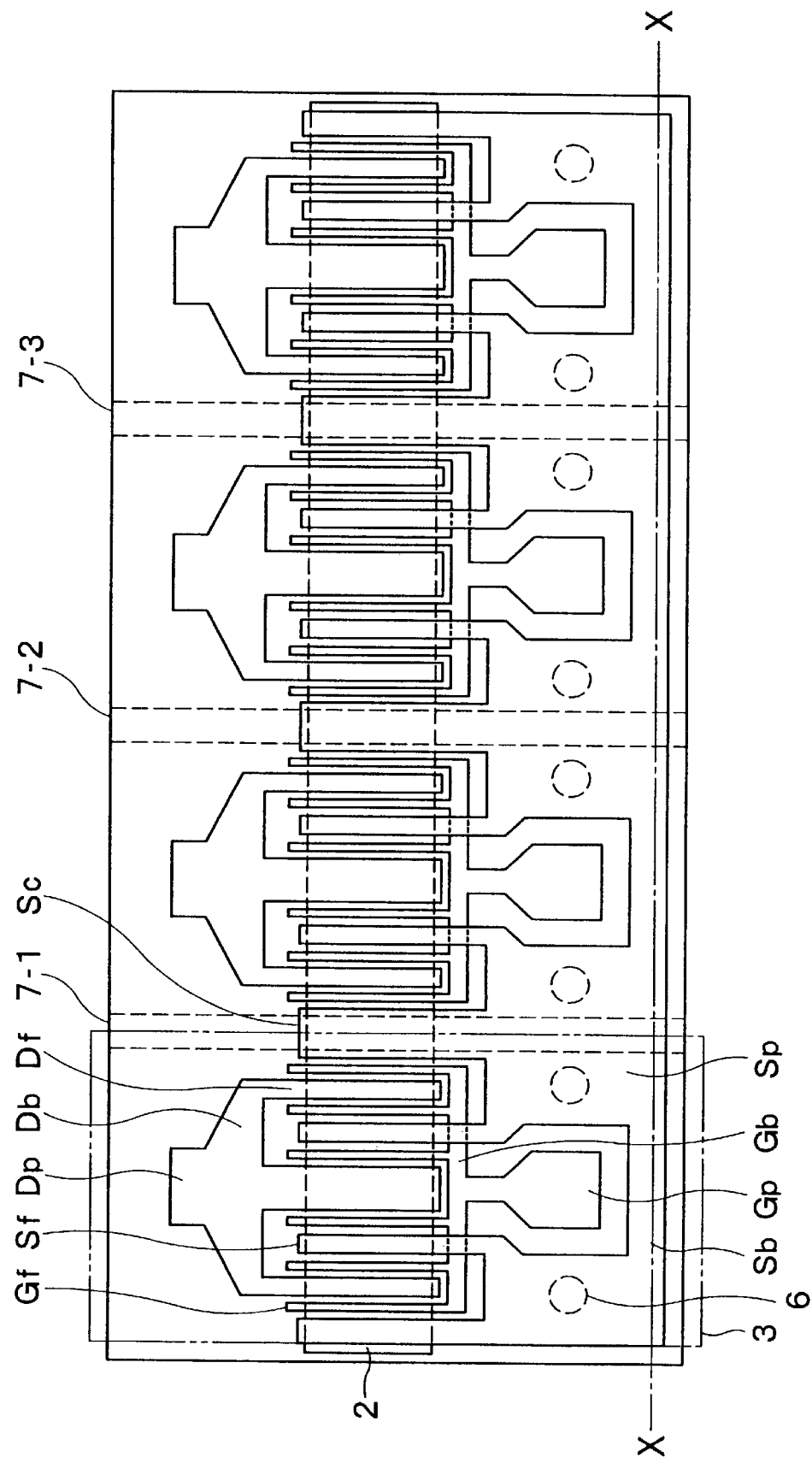
FIG. 4 is a plan view of the second conventional FET chip.
Figure 5:
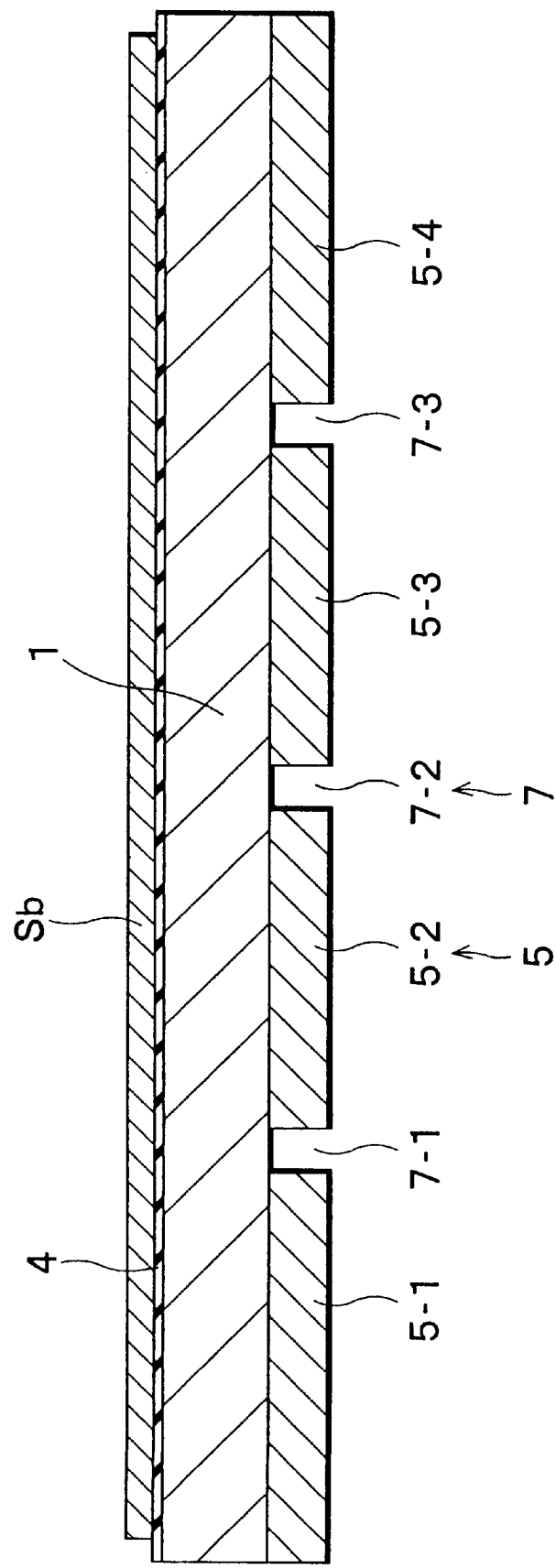
FIG. 5 is a section taken along line V—V of FIG. 4.
Figure 6:
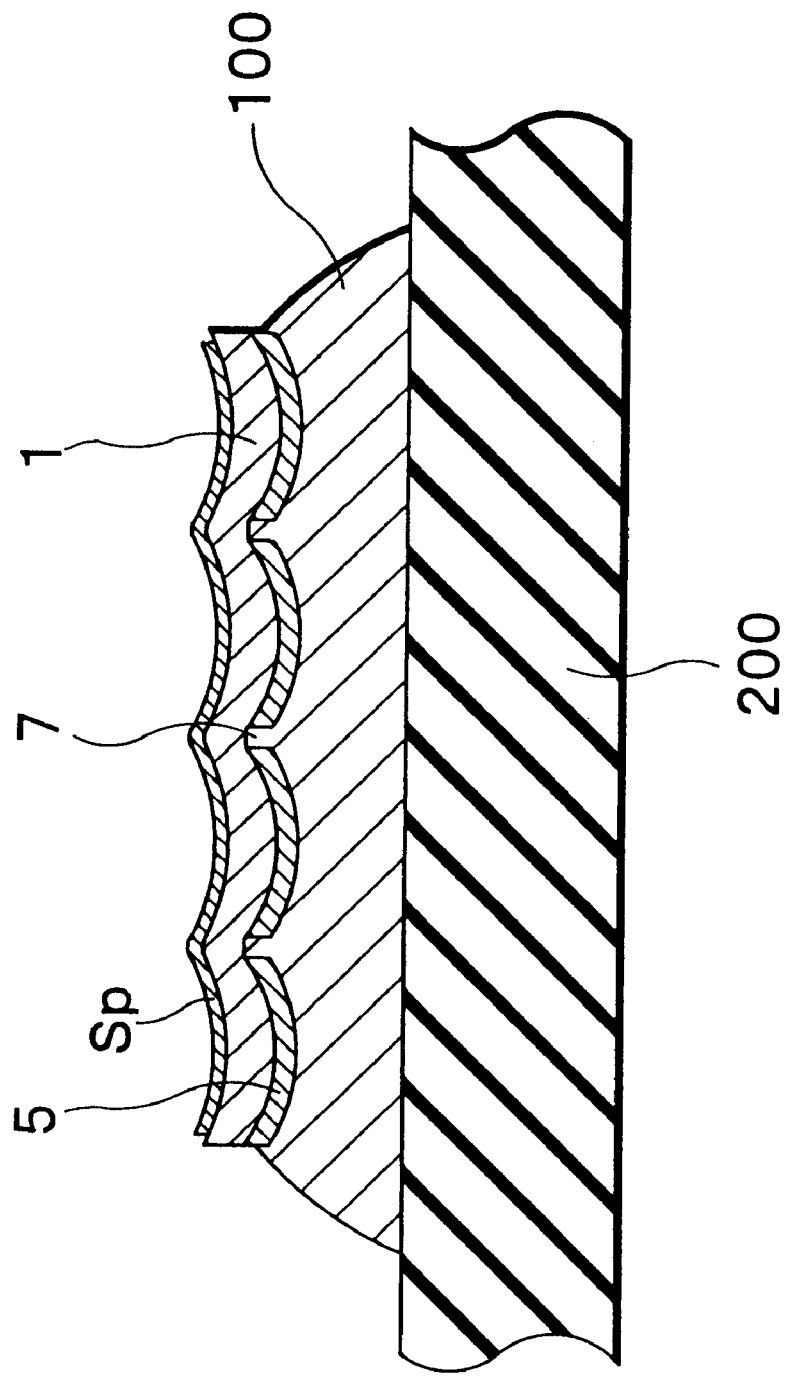
FIG. 6 is a section for explanation for the second conventional FET chip.
Figure 7:
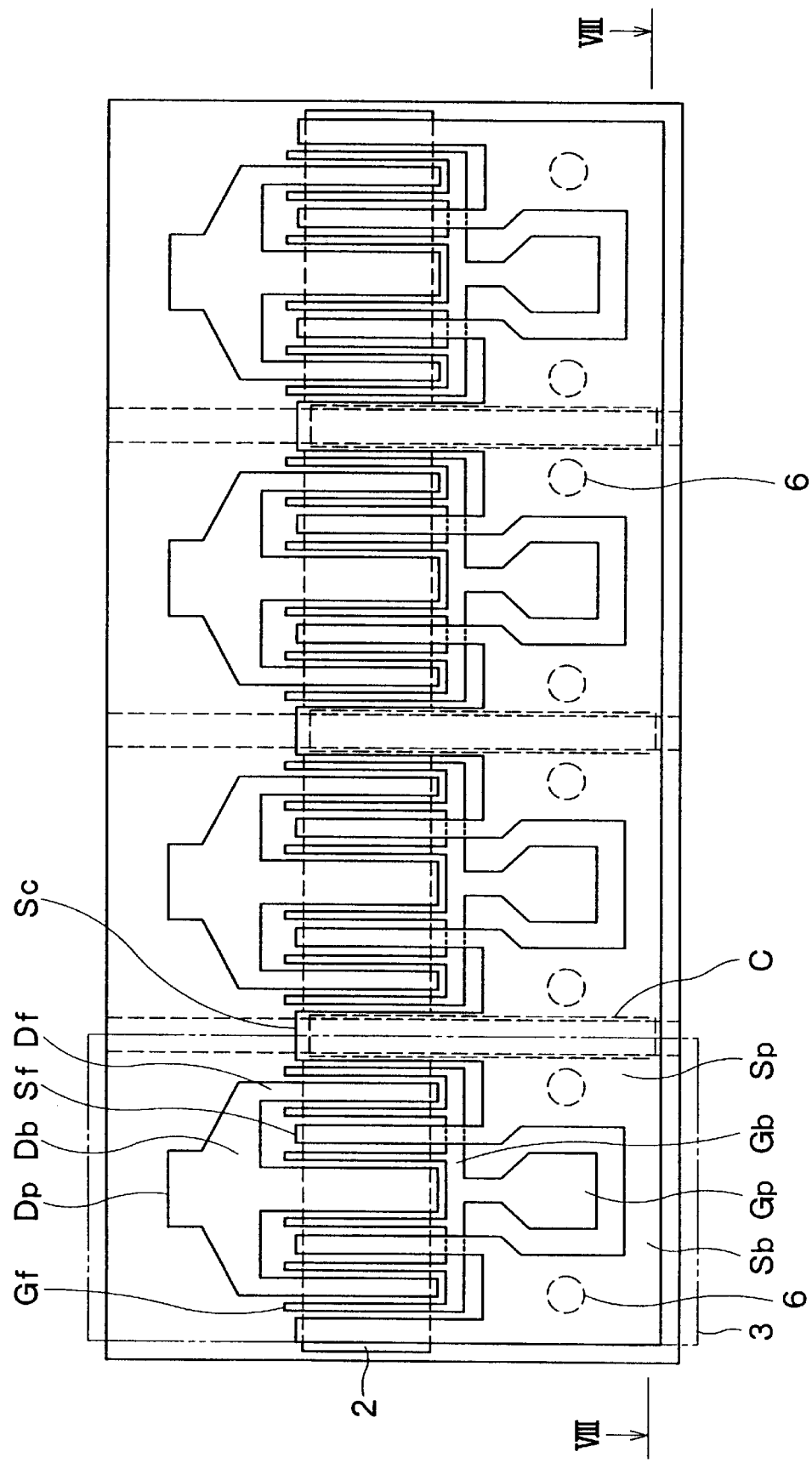
FIG. 7 is a plan view of the first embodiment of a FET chip according to the present invention.
Figure 8:
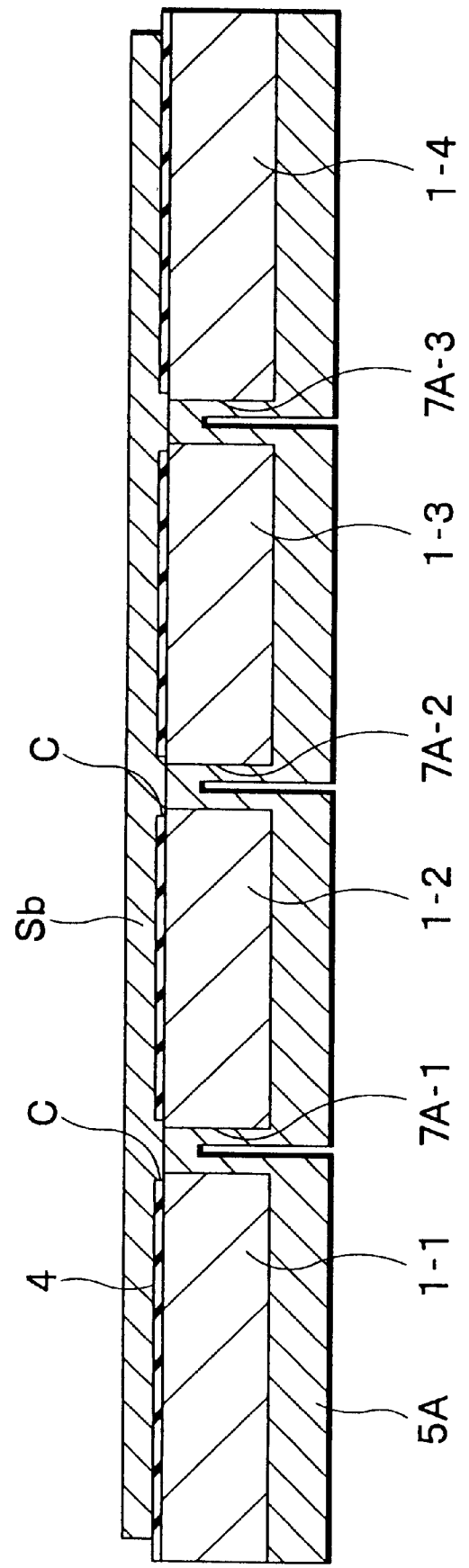
FIG. 8 is a section taken along line VIII—VIII of FIG. 7.

FIG. 7 is a plan view of the first embodiment of a FET chip according to the present invention, and FIG. 8 is a section taken along line VIII—VIII of FIG. 7.

In the shown embodiment, finger-shaped gate electrodes Gf are formed selectively covering an active region 2 on one primary surface portion of a GaAs substrate. At opposite sides of the finger-shaped gate electrodes Gf, finger-shaped source electrodes Sf and finger-shaped drain electrodes Df are formed selectively covering the active region 2 of the GaAs substrate.

Six sets of FETs respectively constituted of the finger-shaped gate electrode Gf, the finger-shaped source electrode Sf and the finger-shaped drain electrode Df, are arranged in parallel relationship to form each individual unit cell 3. In each unit cell 3, adjacent finger-shaped gate electrodes Gf are arranged to have the finger-shaped source electrode Sf or the finger-shaped drain electrode Df in common. In the shown construction four unit cells 3 are arranged in parallel. Between adjacent unit cells 3, source electrode connecting portions Sc connecting the finger-shaped source electrodes Sf are arranged. On the back surface opposite to one primary surface of the GaAs substrate, a PHS is formed. In the semiconductor substrate of the shown embodiment, the GaAs substrate is divided into respective unit cells 3. Namely, the GaAs substrate is divided into four segments 1-1, 1-2, 1-3 and 1-4 by three slits 7A-1, 7A-2 and 7A-3.

The gate electrode is constructed with six finger-shaped gate electrodes Gf, a gate bar Gb connecting the six finger-shaped gate electrodes, and a gate pad Gp connected to the gate bar Gb, for each individual unit cell. The gate pad Gp of each individual unit cell is connected to an external gate terminal of the package by a bonding wire (not shown). Similarly, the drain electrode is constructed with three finger-shaped drain electrodes Df, a drain bar Db connecting the finger-shaped drain electrodes each other, and a drain pad Dp connected to the drain bar, for each individual unit cell. The drain pad of each unit cell is connected to an external drain terminal of the package by a bonding wire (not shown).

The source electrode has four finger-shaped source electrodes Sf, two source pads Sp and a source bar Sb. Among four finger-shaped source electrodes Sf, one or two also serve as the source electrode connecting portion Sc together with the finger-shaped source electrode in adjacent unit cells.

The active region 2 is surrounded by an insulation region formed by ion implantation. A part of surface of the insulation region and the active region is covered with a $SiO_2$ layer 4. The finger-shaped source electrode Sf and the finger-shaped drain region Df are connected with the active region through a contact hole portion (not shown) provided through the $SiO_2$ layer 4.

The source electrode connecting portion Sc is connected to a PHS 5A through a contact hole C provided through the $SiO_2$ layer. Also, the source pad Sp is connected to the PHS 5A through a via hole 6.

Next, a fabrication process of the shown embodiment of the first embodiment of the FET chip will be discussed.

Figure 9A:
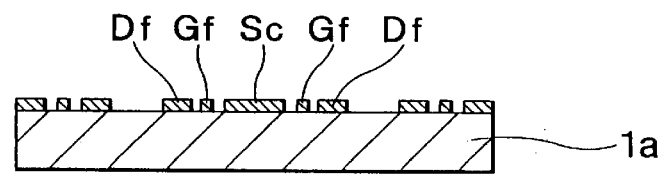
FIGS. 9A to 9F are sections showing a fabrication process of the first embodiment of the FET chip in sequential order of steps.

FIGS. 9A to 9F are sections showing a fabrication process of the TFT chip according to the first embodiment of the present invention in sequential order of steps. As shown in FIG. 9A, the gate electrode, the source electrode, the drain electrode and an electrode pad are formed on the primary surface of a wafer form GaAs substrate 1a.

Figure 9B:
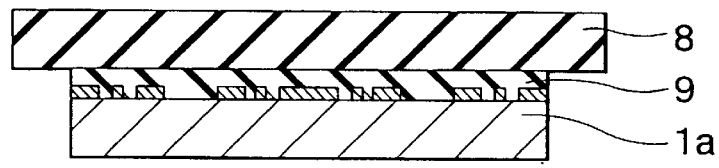

Next, a cover insulation layer (not shown) is formed. An opening is formed in the cover insulation layer at the location of each pad. Thereafter, as shown in FIG. 9B, the GaAs substrate 1a is bonded onto a glass plate 8 by a wax 9.

Figure 9C:
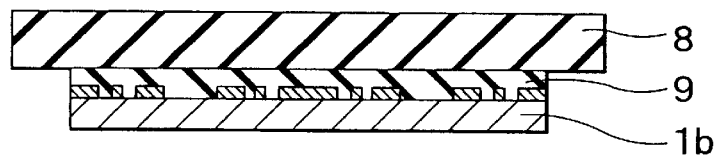

Next, as shown in FIG. 9C, the GaAs substrate 1a is polished to form a GaAs substrate 1b with a thickness of 30 to 50 μm.

Figure 9D:
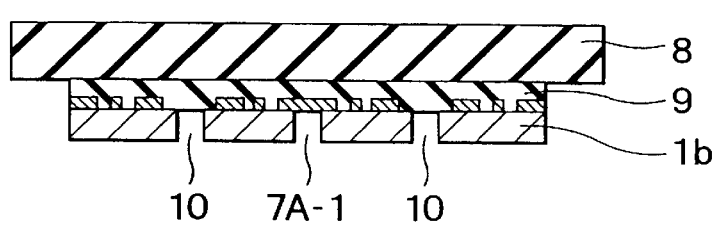

Then, as shown in FIG. 9D, utilizing lithographic technology, etching is performed of the GaAs substrate 1b to form slits 7A-1, 7A-2 and 7A-3, each having a width of about 100 μm (only slit 7A-1 is shown in FIG. 9D), a via hole and scrap grooves 10.

Figure 9E:
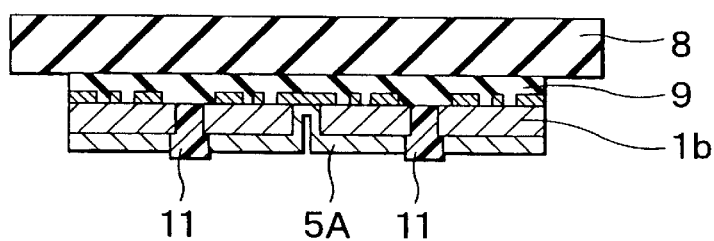

Next, after providing a power supply layer for plating formed by depositing Ti layer and Au layer respectively by sputtering, the scrap groove 10 is filled with a photo-resist layer 11 as shown in FIG. 9E. Thereafter, Au plating is performed to form the PHS 5A having a thickness of about 50 μm.

Figure 9F:
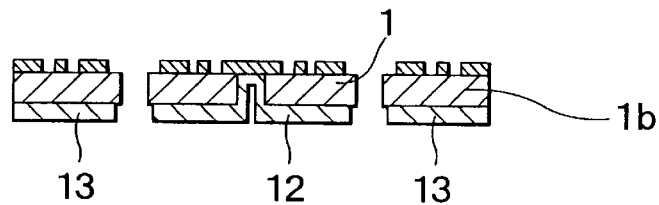

Next, as shown in FIG. 9F, after removing the photo-resist layer 11, the portion of the power supply layer for plating aligned with the scrap groove 10 is milled and wax 9 is removed to remove the glass plate 8. As a result, on FET chip 12 in the order of 3 μm×1 μm is obtained. It should be noted that the reference numeral 13 denotes an individual chip segment created through the chip separation process.

Thus, the FET chip can be separated into respective unit cells. Upon division, since the FET chip is bonded on the glass plate 8 in the wafer condition, and after separation, individual unit cells are integrated by the source electrode, the cover layer and the PHS, the distance between the unit cells causes little dislocation. Therefore, the foregoing defect of prior art multi-chip devices will not be encountered.

Figure 10:
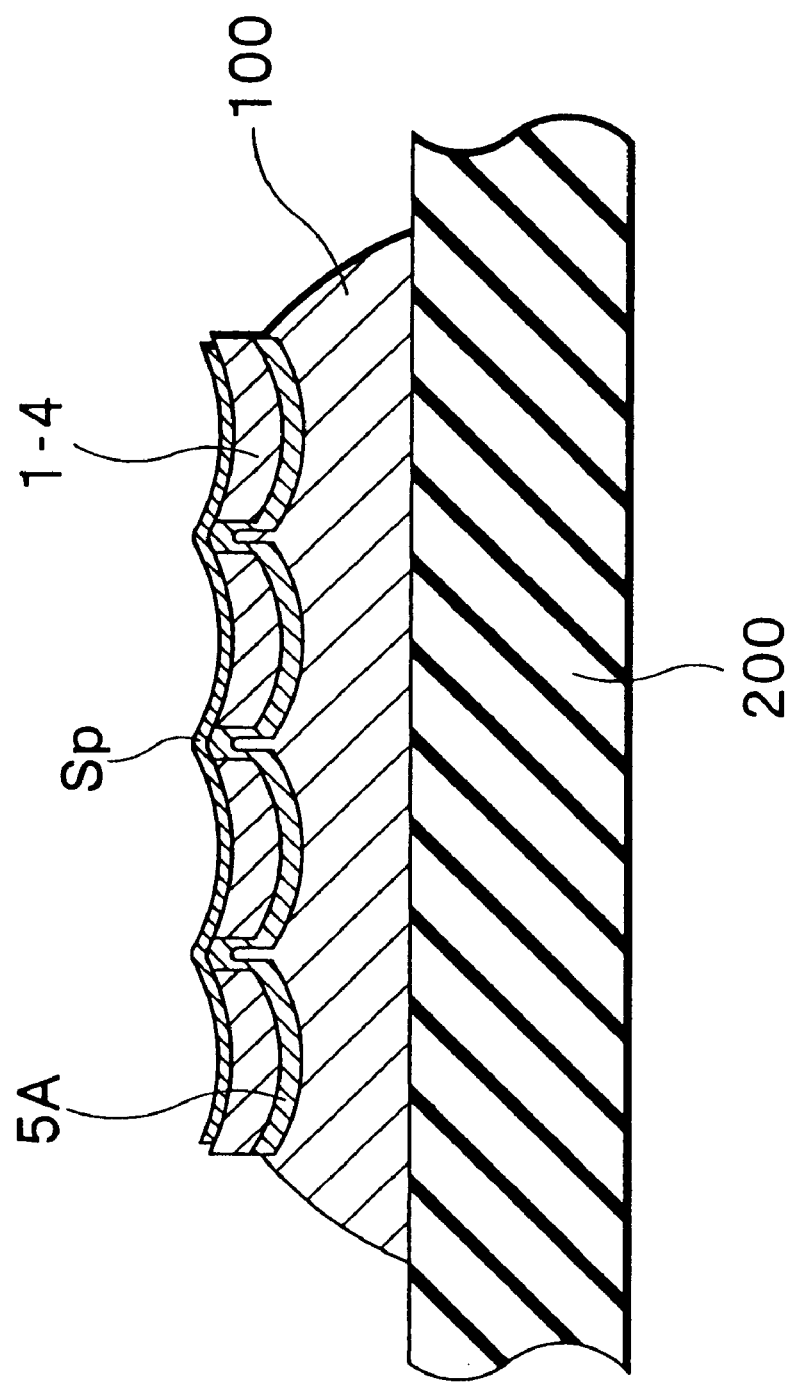
FIG. 10 is a section for explaining the first embodiment of the FET chip.

As shown in FIG. 10, the FET chip is mounted by fixing on package 200 by a solder 100. When heated during soldering, curling can be caused by the difference of the thermal expansion coefficients in the portion forming the two layer structure of the GaAs substrate 1 and the PHS 5A. However, since the GaAs substrate is divided, in the portion where the GaAs substrate is not present, assuming the electrode layer (Sp or so forth, thickness being about 1 μm) is thin enough to be ignored, the layer structure is the single layer of the PHS. Thus, curling will not be caused due to difference between the thermal expansion coefficients.

Furthermore, this portion does not have the GaAs substrate and thus has low mechanical strength. The PHS at the portion where the slit is provided is deformed to curl in the opposite direction to deforming direction of the portion where the slit is not provided, at quite small curvature due to the force to mechanically depressing the chip or the surface tension force of the molten solder. Namely, quite large stress concentration can be provided in the PHS, locally. Stress concentration is provided on the PHS and is not provided on the GaAs substrate. Accordingly, occurrence of shifting dislocation and multiplication can be restricted. Thus, degradation of reliability can be successfully prevented.

Figure 11:
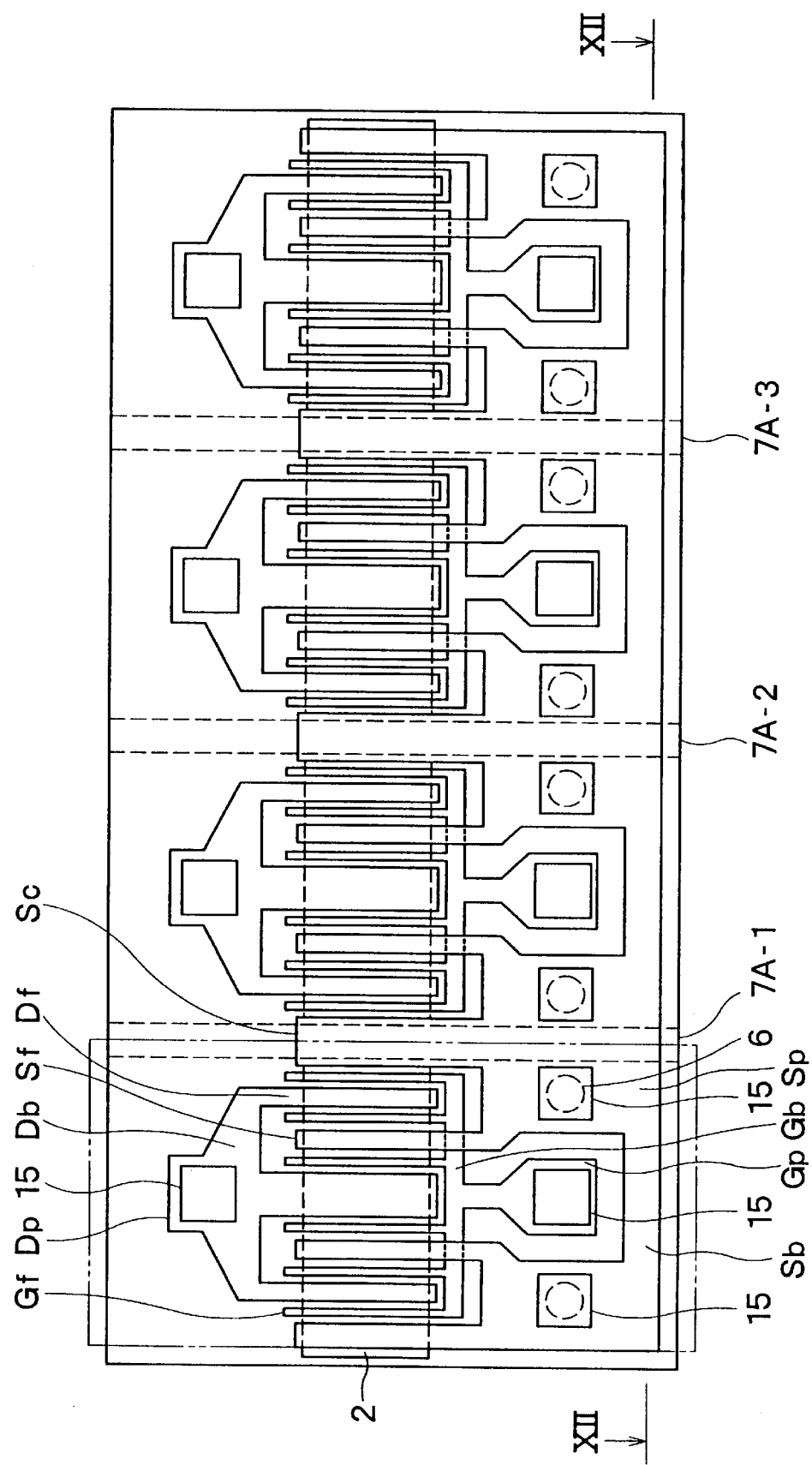
FIG. 11 is a plan view of the second embodiment of a FET chip according to the present invention.
Figure 12:
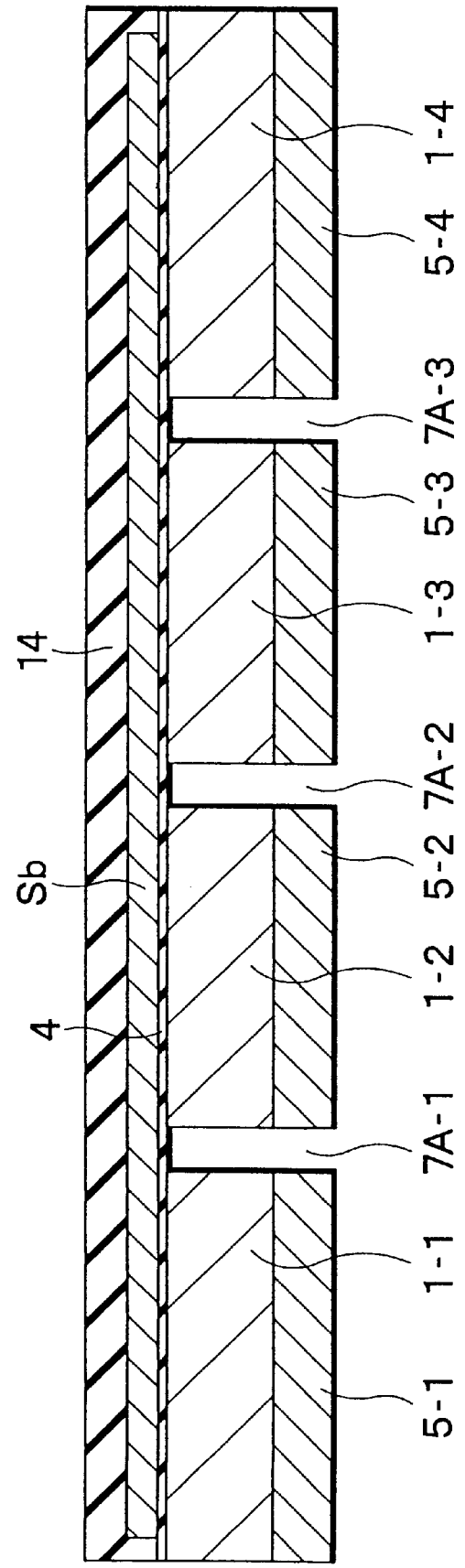
FIG. 12 is a section taken along line XII—XII of FIG. 11.

FIG. 11 is a plan view of the second embodiment of a FET chip according to the present invention, and FIG. 12 is a section taken along line XII—XII of FIG. 11. The electrode pattern of the FET chip is the same as that in the first embodiment.

The GaAs substrate is divided into four segments 1-1 to 1-4 by slits 7A-1 to 7A-3 formed at the boundaries of the unit cells. Similarly, the PHS is also divided into four fractions 5-1 to 5-4. Therefore, for reinforcement, an insulative resin layer 14, such as polyimide is formed on the surface.

In the insulative resin layer 14 and the cover layer (not show) formed therebelow, on opening 15 for bonding is provided. With the source electrode, the cover layer and the insulative resin layer, the FET chip is integrated.

The fabrication process of the shown embodiment is performed by forming the gate electrode or so forth, forming the insulative resin layer 14, and forming the opening 15, subsequently bonding it onto the glass plate, performing back surface polishing and forming the via hole 6, forming the PHS fractions 5-1 to 5-4 and forming Au layer or so forth in the opening portion, performing etching using the PHS 5-1 to 5-4 as mask, and forming individual FET chip segments by forming slits 7A-1 to 7A-3 and scrap grooves.

Figure 13:
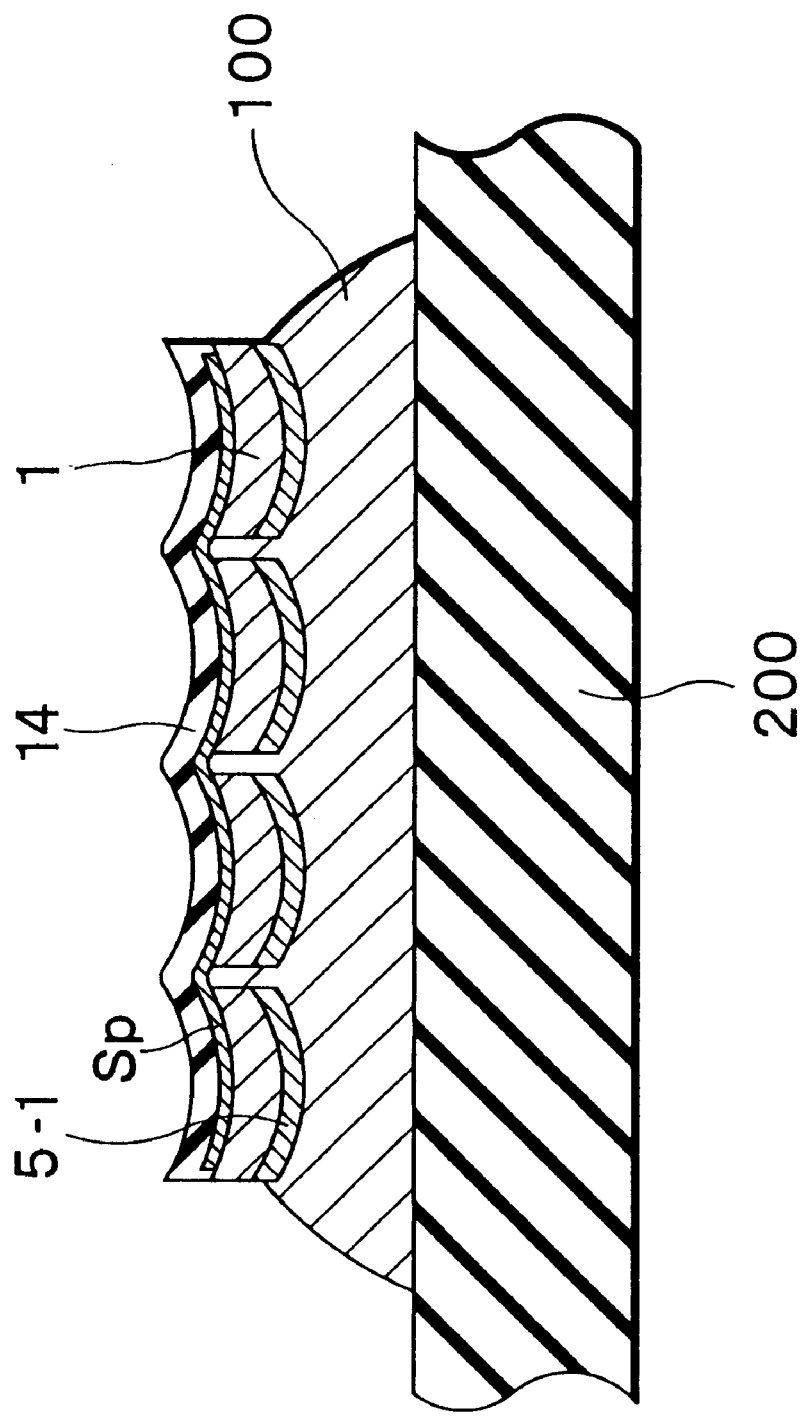
FIG. 13 is a section for explaining the second embodiment of the FET chip.

As shown in FIG. 13, the FET chip is mounted by fixing one package 200 by the solder 100. Heating at that time, the portion forming two layer structure of the GaAs substrate and the PHS layer is curled due to difference of the thermal expansion coefficients similarly to the prior art. However, in the portion where the GaAs substrate and the PHS are not present as being divided, the electrode layer (about 1 μm in thickness) can be thin enough to be ignored, the layer structure becomes a single layer structure of the insulation resin layer 14. Thus, curling due to the difference of the thermal expansion coefficients may not result.

The insulation resin layer 14 is deformed in the opposite direction to deforming direction of the portion where the GaAs substrate and the PHS are present, at quite small curvature due to the force to mechanically depressing the chip or the surface tension force of the molten solder. Then, locally, stress concentration is provided on the insulative resin layer and not on the GaAs substrate. Accordingly, occurrence of shifting dislocation and multiplication can be restricted. Thus, degradation of reliability can be successfully prevented.

In the first embodiment, when the PHS is formed simultaneously with burying the via hole connecting the source electrode and the PHS layer, burying ability is improved by forming thick gold plate layer, pulse plating or so forth, most of the divided portion of the GaAs substrate can be buried by the PHS layer. In such case, the PHS layer of the mechanical strength cannot be low. Then, the stress may be distributed to the GaAs side. However, in the second embodiment, since both of the GaAs substrate and the PHS are separated, such problem will never result.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

For instance, the insulative resin to form the insulation region layer need not be a polyimide, but can be epoxy resin which is used as sealant for a resin sealed semiconductor device or so forth. Moreover, the present invention is applicable not only for a semiconductor device having GaAs substrate but also other semiconductor materials such as InP or so forth.

What is claimed is:

1. A field effect transistor comprising:
   a plurality of unit cells formed adjacent one another on a semiconductor substrate;
   each cell comprising: an active region on one primary surface portion of said semiconductor substrate; a plurality of finger-shaped gate electrodes connected by a first common bar selectively covering said active region; a plurality of finger-shaped source electrodes connected by a second common bar and a plurality of finger-shaped drain electrodes connected by a third common bar which is arranged at opposite sides of said first common bar of said finger-shaped gate electrodes and selectively covering said active region, with said finger-shaped source electrode or said finger-shaped drain electrode being located between mutually adjacent fingers of said finger-shaped gate electrodes;

said semiconductor substrate being divided into a plurality of side-by-side portions arranged parallel to one another by parallel slits which run from the back side of the substrate to said primary surface, each of the unit calls formed on a corresponding portion of the substrate;

a source electrode connecting portion connecting said finger-shaped source electrodes of mutually adjacent unit cells; and a plated heat sink formed on the back side of said slit semiconductor substrate.

2. A semiconductor device as set forth in claim 1, wherein said plated heat sink is connected to said source electrode connecting portion at locations where said semiconductor substrate is slit.

3. A semiconductor device as set forth in claim 1, comprising an insulative resin layer covering said finger-shaped gate electrodes, said finger-shaped source electrodes and said finger-shaped drain electrodes.

4. A semiconductor device as set forth in claim 3, wherein said plated heat sink is separated for each unit cell.

5. A semiconductor device as set forth in claim 1, wherein said semiconductor substrate comprises a GaAs substrate.

\* \* \* \* \*